United States Patent [19]

Sato

[11] 4,113,486

[45] Sep. 12, 1978

[54] METHOD FOR PRODUCING A PHOTOMASK

[75] Inventor: Masamichi Sato, Asaka, Japan

[73] Assignee: Fuji Photo Film Co., Ltd., Minami Ashigara, Japan

[21] Appl. No.: 694,423

[22] Filed: Jun. 9, 1976

Related U.S. Application Data

[63] Continuation of Ser. No. 517,285, Oct. 22, 1974, abandoned.

[30] Foreign Application Priority Data

Oct. 22, 1973 [JP] Japan .................. 48-118692

[51] Int. Cl.$^2$ .................. G03C 5/32; C23F 1/00; G03B 27/00; G03C 11/00
[52] U.S. Cl. .................. 96/36; 96/36.2; 96/38.3; 96/60 R; 156/643; 156/656; 156/657; 156/659; 204/129.65; 204/192 E; 204/192 EC; 204/192 P; 252/79.2; 252/79.3
[58] Field of Search .............. 96/38.3, 36.2, 36, 60 R; 156/8, 12, 13, 3, 643, 656, 657, 659; 204/129.1, 129.65, 192 R, 192 E, 192 EC, 192 P; 252/79.2, 79.3

[56] References Cited

U.S. PATENT DOCUMENTS

| 3,474,021 | 10/1969 | Davidse et al. ............... 156/8 X |
| 3,561,963 | 2/1971 | Kiba .......................... 96/38.3 UX |
| 3,567,447 | 3/1971 | Chand ........................ 96/36 |
| 3,639,125 | 2/1972 | Chand ........................ 96/36.2 X |
| 3,669,665 | 6/1972 | Faigenbaum et al. ........... 96/36.2 X |
| 3,674,492 | 7/1972 | Goldrick et al. ............. 96/38.3 X |
| 3,761,260 | 9/1973 | de Ramaix ................... 96/60 R |
| 3,765,901 | 10/1973 | Schellekens et al. .......... 96/36.2 X |
| 3,870,520 | 3/1975 | Shimamura et al. ............ 96/60 R |

*Primary Examiner*—William A. Powell
*Assistant Examiner*—Thomas Bokan
*Attorney, Agent, or Firm*—Sughrue, Rothwell, Mion, Zinn and Macpeak

[57] ABSTRACT

A method for producing a photomask, which comprises exposing and development-processing a photographic light-sensitive material comprising a transparent support having thereon a masking layer and a silver halide emulsion layer to thereby form a silver image, bleaching the silver image with a bleaching solution containing hexavalent chromium ion, heating in the presence of oxygen to imagewise uncover the masking layer, etching away the uncovered masking layer, and then removing the emulsion layer at the non-image areas to uncover the masking layer corresponding to the non-image areas.

25 Claims, 6 Drawing Figures

METHOD FOR PRODUCING A PHOTOMASK

This is a continuation of application Ser. No. 517,285, filed Oct. 22, 1974, abandoned.

BACKGROUND OF THE INVENTION

1. Field of the Invention

The present invention relates to a method for producing a photomask and, more particularly, it relates to a method for easily producing a photomask having high accuracy and high quality using a silver halide photographic material.

2. Description of the Prior Art

It is known in the field of printed circuit fabrication or microelectronic fabrication to use a photomask in forming images utilizing a photoresist method. Heretofore, the photomask has often utilized silver images or chromium images. Silver images are obtained by imagewise exposing a photographic light-sensitive material (emulsion mask) provided on a glass plate, followed by ordinary photographic processings (e.g., development and fixing). On the other hand, chromium images are formed by providing a vacuum-deposited chromium layer on a glass support and etching the chromium layer using a photo etching method. That is, a photo resist is coated on the chromium layer and, after exposure through a photo mask superposed thereon (contact method) or after projecting a photo mask on to the photoresist (projection method), the photoresist is development-processed to form a resist image, followed by etching the chromium layer.

Since an emulsion mask has high sensitivity, it is suitable for preparing a photo mask. However, the resolving power of the photo mask obtained is inferior to that of the chromium mask using the projection method due to scattering of light by the silver grains, high thickness of the silver halide emulsion layer and the silver particles after development. A photo mask utilizing a silver image is inferior in resolving power for the following additional reason. That is, since the developed emulsion thickness is larger at silver image areas that at non-image areas, gaps or spaces are formed at the contact surfaces upon intimately contacting the photo mask with the photoresist layer in order to form a resist image, thus markedly reducing the resolving power. In addition, the photo mask formed by the silver image has such as small mechanical strength that it is easily damaged. Also, since a silver image does not transmit visible light, positioning of the mask is difficult.

On the other hand, a chromium mask using a contact method is inferior to the photo mask obtained from a silver image in resolving power, since the former is reduced in resolving power upon exposing a photoresist layer and upon etching the vacuum-deposited chromium layer. Also, with a chromium mask using the projection method, the photoresist layer has such a low sensitivity that exposure requires too much time, and thus it is not practical industrially.

SUMMARY OF THE INVENTION

It is, therefore, an object of the present invention to provide a method for producing a photomask having high sensitivity, high resolving power and excellent durability.

Another object of the present invention is to provide a method for producing a photomask without using a photoresist process.

The above-described objects of the present invention can be attained by exposing and development-processing a photographic light-sensitive material comprising a transparent support having thereon a masking layer and a silver halide emulsion layer to thereby form a silver image, bleaching the silver image with a bleaching solution containing hexavalent chromium ion, heating the bleached material in the presence of oxygen to imagewise uncover the masking layer, etching away the uncovered masking layer, and then removing the emulsion layer at the non-image areas to uncover the masking layer corresponding to the non-image areas.

DETAILED DESCRIPTION OF THE INVENTION

Figure 1:
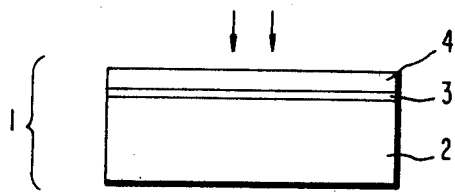
FIGS. 1 through 6 are illustrations showing one embodiment of the method of the present invention. In each figure, numeral 1 designates a photographic light-sensitive material, 2 a transparent support, 3 a masking layer, 3a a masking layer corresponding to the silver image areas, 3b a masking layer corresponding to the non-silver image areas, 4 a silver halide emulsion layer, 4a silver image areas, 4b a binder layer (non-silver image areas), 4c a silver halide image and 5 a photo mask.

The photographic material which is used in the present invention fundamentally comprises a transparent support having thereon a masking layer and a silver halide emulsion layer.

That is, the photographic material is different from ordinary silver halide photographic materials due to the presence of the masking layer. It should be noted that the masking layer performs an extremely important function when combined with the procedures of bleaching and baking to be described hereinafter.

The transparent support designates a glass plate, quartz, sapphire, plastic film (e.g., a cellulose acetate film, a cellulose nitrate film, a polyethylene terephthalate film, a polystyrene film, heat resistive high melting polymer such as poly(pyromellitic acid-p-phenylenediamineimide), poly(p-oxybenzoate), poly(ethylene-2,6-naphthalate), polyamidoimide polymers as described in U.S. Pat. No. 3,554,984, polyimidoimine polymers as described in U.S. Pat. No. 3,472,815, etc.), and the like.

The support must be transparent since transparency is a necessary condition for mask-positioning as is well known in the conventional photomask art. However, the transparent support is not particularly limited in the present invention with respect to its other characteristics.

The term "transparent support" as used herein in the present invention designates a support which comprises a substance capable of transmitting not less than 50%, preferably not less than 70%, of electromagnetic waves in the near-ultraviolet (e.g., about 2900 to 4000 Å) and visible light regions (e.g., about 4000 to 7000 Å).

The masking layer is provided by depositing a masking material on a transparent support using vacuum deposition, sputtering, ion plating, chemical plating or the like. Suitable masking materials are metal oxides such as silicon dioxide, chromic oxide, ferric oxide, magnetic iron oxide, (iron (II) iron (III) oxide), cuprous oxide, cupric oxide, nickel oxide, cobalt oxide, germanium oxide, cadmium oxide, titanium oxide, or tantalum oxide, etc., metals such as chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, nickel-chromium alloy, etc., semi-metals such as silicon, germanium, etc., chalcogen glasses such as As—S—GE, As—Se—Ge, Ge—S, etc., and the like. The masking material provides a masking effect, particularly, to light, and is preferably selected from those materials which transmit visible light and absorb ultraviolet light.

The thickness of the masking layer cannot be definitely specified since it will vary depending upon the end-use thereof. However, in general, a range of from about 0.01 to 10μ, preferably 0.07 to 1.5μ, is employed. If the layer is too thin, adsorption of ultraviolet light is too small, while, if the layer is too thick, etching become difficult, and the problem of side-etching occurs. Since a metal or a metal oxide possesses a much greater mechanical strength as compared with a photographic emulsion layer or the like, a metal or metal oxide can render the photo mask scratch-resistant.

The silver halide emulsion is coated on the masking layer or on a subbing layer or layers on the masking layer. The subbing layer which can be used in the present invention is a layer which intimately adheres to both the masking layer and the silver halide emulsion layer. Where the masking layer is extremely different in property from the silver halide emulsion layer, two or more subbing layers can be employed. More specifically, those subbing layers described in Japanese Patent Publication Nos. 5509/64, 2597/69, 11616/71, U.S. Pat. No. 3,492,122, West German Patent OLS No. 2,001,727, etc., are suitable. Also, a subbing layer formed by providing a thin polyvinyl acetate layer (for example, a thickness of about 0.1 to 0.3μ) and bringing the surface into contact with an alkaline aqueous solution such as an aqueous solution of sodium hydroxide for saponification can be used. A suitable thickness for the subbing layer can range from about 0.1 to 0.5μ.

The silver halide emulsion coated on the masking layer or on the subbing layer can be obtained by dispersing silver halide in an water-soluble binder. Examples of silver halides, are silver chloride, silver bromide, silver iodide, silver chlorobromide, silver bromoiodide, silver chlorobromoiodide, etc. A most typical silver halide emulsion is an emulsion which contains about 90 mol% or more silver bromide (preferably containing not more than about 5 mol% silver iodide) and contains silver halide grains of a mean grain size of not more than about 0.1μ (a so-called Lippmann emulsion), and in which the weight ratio of the silver halide to the water-soluble binder is about 1:4 to about 6:1. Another example of a silver halide emulsion is an emulsion which contains about 50 mol% or more (preferably about 70 mol% or more) silver chloride and contains silver halide grains of a mean grain size of not more than about 1.0μ.

On the other hand, illustrative water-soluble binders, are e.g., gelatin, colloidal albumin, casein, cellulose derivatives (e.g., carboxymethyl cellulose, hydroxyethyl cellulose, etc.), saccharide derivatives (e.g., agar-agar, sodium alginate, starch derivatives, etc.), synthetic hydrophilic colloids (e.g., polyvinyl alcohol, poly-N-vinyl pyrrolidone, polyacrylic acid copolymer, polyacrylamide, the derivatives thereof, etc.). If desired, a compatible mixture of two or more of these binders can be used. Of these, a most preferred binder is gelatin. Gelatin can be replaced, partly or completely, by a synthetic high molecular weight substance, by a so-called gelatin derivative (prepared by reacting gelatin with a compound having a group capable of reacting with the functional groups contained in the gelatin molecule (i.e., amino groups, imino groups, hydroxy groups or carboxy groups)), or by a graft polymer prepared by grafting the molecular chain of another high molecular substance to the gelatin molecule of preparing gelatin derivatives, e.g., isocyanates, acid chlorides and acid anhydrides as described in U.S. Pat. No. 2,614,928, acid anhydrides as described in U.S. Pat. No. 3,118,766, bromoacetic acid as described in Japanese Patent Publication No. 5514/64, phenyl glycidyl ethers as described in Japanese Patent Publication No. 2184/67, vinyl sulfone compounds as described in U.S. Pat. No. 3,132,945, N-allylvinylsulfonamides as described in British Pat. No. 861,414, malein-imide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Patent Publication No. 26845/67, acid esters as described in U.S. Pat. No. 2,763,639, alkanesultones as described in British Pat. No. 1,033,189, and the like. Suitable branch high polymers to be grafted to the gelatin, are described in U.S. Pat. Nos. 2,763,625, 2,831,767, 2,956,884, *Polymer Letters,* 5, 595 (1967), *Phot. Sci. End.*, 9, 148 (1965), *J. Polymer Sci. A-1,* 9, 3199 (1971), and the like. Homopolymers or copolymers of those compounds which are generally called vinyl monomers, such as acrylic acid, methacrylic acid, the ester, amide, and nitrile derivatives thereof, styrene, etc. can be widely used. However, hydrophilic vinyl polymers having some compatibility with gelatin, such as homopolymers or copolymers of acrylic acid, acrylamide, methacrylamide, hydroxyalkyl acrylate, hydroxyalkyl methacrylate, etc. are particularly preferred.

These emulsions are advantageously optically sensitized with known optical sensitizers, such as the cyanine dyes and merocyanine dyes as described in U.S. Pat. Nos. 1,346,301, 1,846,302, 1,942,854, 1,990,507, 2,493,747, 2,739,964, 2,493,748, 2,503,776, 2,519,001, 2,666,761, 2,734,900, 2,739,149 and British Pat. No. 450,958.

Suitable exposures of the silver halide emulsion can be to electromagnetic radiation, to which the silver halide emulsion is sensitive, e.g., visible, ultraviolet, electron beams X-rays etc. With the optically sensitized photographic light-sensitive materials, it is convenient to select light mainly having a wavelength corresponding to the optically sensitized region of the emulsion as the light for exposing the emulsion layer.

The emulsion can be advantageously chemically sensitized with the salts of noble metals such as ruthenium, rhodium, palladium, iridium, platinum, etc. as described in U.S. Pat. Nos. 2,448,060, 2,566,245, and 2,566,263. Also, as is described in U.S. Pat. No. 2,339,083, the emulsion can be chemically sensitized with a gold salt or, as is described in U.S. Pat. Nos. 2,597,856 and 2,597,915, the emulsion can be stabilized with gold metal. Furthermore, a thiopolymer as described in U.S. Pat. No. 3,046,129 can advantageously be incorporated in the emulsion. In addition, the emulsion can be stabilized with mercury compounds as described in U.S. Pat. No. 3,046,129, column 20, line 51 to column 21, line 3, triazoles, azaindenes, disulfides, quaternary benzothiazolium compounds, zinc salt and cadmium salts.

The emulsion can contain light-absorbing dyes as described in U.S. Pat. Nos. 2,527,583, 2,611,696, 3,247,127, 3,260,601, etc.

The emulsion is advantageously hardened with a suitable hardening agent for hydrophilic colloids, such as formaldehyde or a like hardener; N-methylol compounds as described in U.S. Pat. Nos. 2,732,316 and 2,586,168; carbodiimide compounds as described in U.S. Pat. No. 3,100,704; epoxy compounds as described in U.S. Pat. No. 3,091,537; halogen-substituted fatty acids (e.g., mucobromic acid, etc.); compounds having many acid anhydride groups; methanesulfonic acid bisester; dialdehydes or the sodium bisulfite adducts thereof such as β-methylglutaraldehyde bissodium bisulfite; bisaziridinecarboxamide (e.g., trimethylenebis(1-aziridinecarboxamide)); triazine derivatives (e.g., 2-hydroxy-4,6-dichloro-s-trizaine, etc.); and the like.

The silver halide emulsion is coated with or without adding a coating aid as described in U.S. Pat. No. 3,046,129. The silver halide emulsion layer can have a thickness of about $0.3\mu$ or above and preferably has a thickness of less than about $10\mu$ and can be coated in one or more layers.

If desired, a backing layer, an anti-halation layer, an interlayer, an uppermost layer (e.g., a protective layer, etc.), and the like, can be provided, on the support, the masking layer or on the emulsion layer.

Formation of a silver image in the silver halide emulsion layer can be effected using conventional photographic processings, that is, by development-processing the exposed emulsion layer and, if necessary, fixing. Conventional photographic processings including exposure, development, fixing, etc., which can be used are described in detail in "Techniques of Microphotography" Kodak Data Book P-52 (Eastman Kodak Co., Rochester, N.Y., 1970).

Suitable developing agents which can be used in the method of the present invention for forming silver images are those well known in the art, such as the dihydroxybenzenes (e.g., hydroquinone, chlorohydroquinone, bromohydroquinone, isopropylhydroquinone, toluhydroquinone, methylhydroquinone, 2,3-dichlorohydroquinone, 2,5-dimethylhydroquinone, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), the aminophenols (e.g., o-aminophenol, p-aminophenol, N-methyl-o-aminophenol, N-methyl-aminophenol, 2,4-diaminophenol, etc.), pyrogallol, ascorbic acid, the 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)3-aminopyrazoline, etc.), and mixtures thereof. The developer generally possesses a pH of not less than about 8, preferably about 8.5 to 12.5.

The developer can contain, if desired, a preservative (e.g., a sulfite, a bisulfite, etc.), a buffer (e.g., a carbonate, boric acid, a borate, an alkanolamine, etc.), a dissolving aid (e.g., polyethylene glycol, etc.), a pH-adjusting agent (e.g., acetic acid or a like organic acid, etc.), a sensitizing agent (e.g., a quaternary ammonium salt, etc.), a development accelerator, a surface active agent, etc.

Suitable fixing agents for silver halide can be those generally well known solvents for silver halide, such as a water-soluble thiosulfate (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water soluble organic diol (e.g., 3-thia-1,5-pentanediol, 3,6-dithia-b 1,8-octanediol, 3,6,9-trithia-1,11-undecanediol, 3,6,9,12-tetrathia-1,14-tetradecanediol, etc.), a water-soluble, sulfur containing organic dibasic acid (e.g., ethylenebisthioglycolic acid, etc.), water-soluble salts thereof (e.g. sodium ethylenebisthioglycolate, potassium ethylenebisthioglycolate), and a mixture thereof.

The fixing agent-containing solution can contain, if desired, a preservative (e.g., a sulfite, a bisulfite, etc.), a pH-buffer (e.g., boric acid, or borate, etc.), a pH-adjusting agent (e.g., acetic acid, etc.), a chelating agent, and the like.

Thus, a silver image is formed in the exposed areas. In the unexposed areas, silver halide is removed through fixation, while the binder in the silver halide emulsion layer in these areas remains intact. Where a silver halide emulsion is a reversal type emulsion or where reversal processing is conducted, the binder layer remains in the exposed areas, whereas a silver image is formed in the unexposed areas. The silver image formed at this stage is so poor in mechanical strength that it is difficult to use the silver image many times as a photo mask.

Then, the silver image is bleached with a bleaching solution containing hexavalent chromium ion. Two types of bleaching can be conducted: a bleaching in which the silver image is converted to a silver halide image; and a bleaching in which silver is dissolved in a bleaching solution to result in image areas which do not contain silver halide. Where silver halide is formed by bleaching, it is to be dissolved away prior to the subsequent steps. Suitable bleaching solutions include an aqueous solution of a mixture of a chromium compound containing hexavalent chromium ion (e.g., sodium dichromate, potassium dichromate, ammonium dichromate, sodium chromate, potassium chromate, ammonium chromate, etc.), and a halide (e.g., NaCl, KCl, NaBr, KBr, etc.) or an acid (e.g., HCl, sulfuric acid, etc.). A suitable chromium ion concentration can range from about 0.5 g/l to a saturated solution, preferably 5 to 100 g/l. A suitable acid concentration ranges from about 0.1 to 200 ml/l, preferably 0.25 to 10 ml/l for 98 wt% $H_2SO_4$, 35 wt% HCl and 70 wt% $HNO_3$, etc., and a suitable halide concentration ranges from about 1 g/l to a saturated solution, preferably 5 g/l to a saturated solution. A suitable temperature for the bleaching can range from about 10° to 60° C., preferably 15° to 40° C., for about 10 sec. to 10 min. When silver halide is removed from the image areas after bleaching, the photographic material is washed with water, dried and baked. Baking is conducted in order that the bleached image areas are rapidly evaporated and that the emulsion layer at the non-image areas does not permit permeation of an etching solution or is not swollen or dissolved by an etching solution in the subsequent etching processing. Surprisingly, it has been discovered that, when the emulsion layer is heated after bleaching, the image areas are evaporated at a rate surprisingly faster than the non-image areas while the non-image areas become etching solution-impermeable even though they turn brown due to the decomposition of the binder. Considering that a non-baked emulsion layer cannot be a resist due to permeation of an etching solution will facilitate an understanding of the importance of baking in the present invention.

As to the baking conditions, baking can be effected by heating at least an emulsion layer in an oxygen containing gas at temperatures not less than about 150° C., preferably 300° to 500° C. Any oxygen containing gas can be used such as a mixture of argon and oxygen, a mixture of air and oxygen, a mixture of hydrogen and oxygen, a mixture of carbon dioxide and oxygen, air, oxygen alone, etc. If the baking temperature is too low, the baking time increases, while, if the baking temperature is too high, the support is deformed. At this stage, the masking layer does not undergo any mechanical change.

Subsequent to the baking, etching is conducted in order to remove the uncovered masking layer. Therefore, the kind of etching solution and the processing conditions which can be used are those ordinarily used in the art. In etching, sputtering can be used as well as usual chemical etching.

Chemical etching as used in this invention includes the so-called etching and etch-bleaching. Etching is effected using methods usually employed for the metal or the metal oxide, etc. Suitable etching solutions which can be used for chromium and chromium oxide ($Cr_2O_3$) include an aqueous solution of cerium ammonium nitrate (at a concentration of about 80 to 250 g/l) and 70 wt% perchloric acid (in an amount of about 20 to 80 ml/l) with an etching time of about 15 sec to 10 min at a temperature of about 15° to 40° C., or an aqueous solution of cerium (IV) sulfate (at a concentration of about 40 to 200 g/l) and concentrated (98%) sulfuric acid (in an amount of about 20 to 100 ml/l) with an etching time of about 20 sec to about 10 min at a temperature of about 15° to 40° C., etc., for iron oxide include an aqueous solution of hydrochloric acid (at a concentration of about 1 to 12N) with an etching time of about 10 sec to 4 min at a temperature of about 30° to 60° C., etc., for silicon dioxide include hydrofluoric acid in an aqueous solution (at a concentration of about 6 to 48% by weight) with an etching time of about 10 sec to 1 min at a temperature of about 15° to 40° C., a mixture of about 0.5 to 2 parts by volume of hydrofluoric acid (48% by weight aqueous solution) and about 6 to 24 parts by volume of ammonium fluoride (40% by weight aqueous solution) with an etching time of about 30 sec to 5 min at a temperature of about 15° to 40° C., etc., for nickel include an aqueous solution of ferric chloride (at a concentration of about 5 to 300 g/l) with an etching time of about 1 to 5 min at a temperature of about 15° to 40° C., for titanium include an aqueous solution of hydrofluoric acid (at a concentration of about 5 to 40% by weight) with an etching time of about 20 sec to 2 min at a temperature of about 20° to 40° C., etc.

The masking layer at the areas corresponding to the image is removed through etching processing to uncover the surface of the support. Since the masking layer and the baked emulsion layer remain on the non-image areas, removal of the emulsion layer is then conducted. The baked emulsion layer can easily be removed by swelling or dissolving the binder layer. The removal of the binder can be effected by using an alkali (e.g., an aqueous solution of sodium hydroxide or potassium hydroxide at a concentration of about 10 to 20% by weight at about 40° to 60° C. for about 2 to 10 min, etc.), an acid (e.g., concentrated sulfuric acid (98% by weight) at about 60° to 98° C. for about 5 to 10 min, or concentrated nitric acid (70% by weight) at about 60° to 95° C. for about 2 to 10 min, etc.) or a salt (e.g., an aqueous solution of sodium hypochlorite or potassium hypochlorite at a concentration of about 10 to 20% by weight at about 30° to 60° C. for about 1 to 5 min, etc.).

Thus, a photo mask which transmits ultraviolet light only at the areas corresponding to the image areas is obtained. That is, this photo mask forms a mask image which is in a positive-positive relationship with the original. Of course, a mask image in a negative-positive relationship with an original can be obtained by using a reversal emulsion and/or conducting reversal processing as has been described above.

The present invention will be described in greater detail by reference to the accompanying figures.

FIGS. 1 through 6 schematically illustrate the steps of the production of a photo mask in accordance with the present invention.

Figure 2:
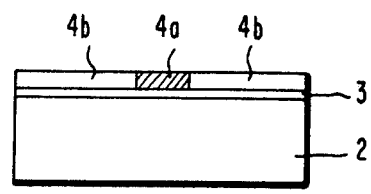
Figure 3:
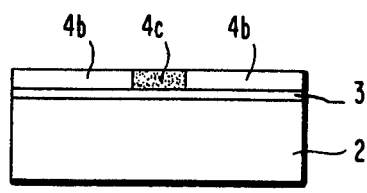
Figure 4:
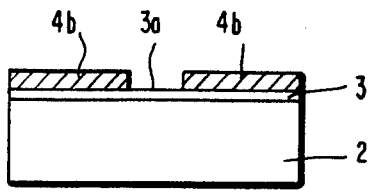
Figure 5:
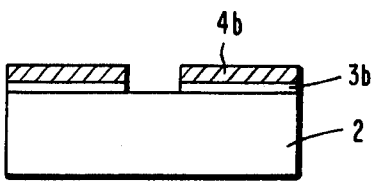
Figure 6:
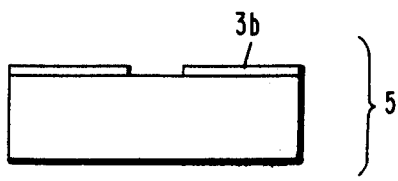

In FIG. 1, photographic light-sensitive material 1 comprises transparent support 2 having thereon masking layer 3 and silver halide emulsion layer 4. When photographic light-sensitive material 1 is exposed in the direction indicated by the arrows and then development-processed and fixed, silver image areas 4a and binder layer (non-silver image areas) 4b are formed as illustrated in FIG. 2. Upon immersing the composite in a bleaching solution, silver image areas 4a are bleached as illustrated in FIG. 3 and converted to silver halide image 4c. Subsequently, the silver halide is dissolved away. Upon baking the emulsion layer, image areas are evaporated as illustrated in FIG. 4 to expose the masking layer 3a. At this point, non-image areas 4b are colored due to the decomposition of the binder. Subsequent etching removes masking layer 3a as illustrated in FIG. 5 to leave baked binder layer 4b and masking layer 3b lying thereunder. Finally, baked binder layer 4b is removed to leave masking layer 3b. Thus, a photo mask as illustrated in FIG. 6 is obtained.

According to the method of the present invention, a photo mask can be produced without using a photoresist method, and thus the steps are simplified.

In addition, the resulting photo mask possesses high resolving power, high sensitivity and markedly improved durability.

FIGS. 1 through 6 show only an embodiment of the present invention. As another embodiment of the invention, the following method can also be practiced. When the photographic material is bleached with a halide-free bleaching solution (e.g., an aqueous solution containing potassium dichromate and sulfuric acid) after forming and fixing the silver image as illustrated in FIG. 2, silver halide is not formed at image areas even though the silver image is bleached. In this case, the step of dissolving the silver halide is not necessary and baking can be immediately conducted.

Also, when the photographic material is bleached without fixation with the above-described halide-free bleaching solution after forming the silver image through development as illustrated in FIG. 2, the silver at image areas is dissolved away while silver halide remains at the non-image areas. When baking is effected after washing and drying, the binder at the image areas is rapidly evaporated while the binder at the non-image areas containing silver halide is decomposed and colored.

As is described above, the present invention is characterized in that a solution containing hexavalent chromium ion is used as a bleaching solution. When other known bleaching solutions than this are used, the effects of the present invention (that image areas are rapidly evaporated by baking) are not achieved. For example, a bleaching solution comprising potassium ferricyanide and potassium bromide cannot be used in the present invention. A bleaching solution containing ferric chloride does not provide the effects of the present invention, either.

In the present invention, the optical density of the silver image is not necessarily different from the optical density of ordinary silver halide photography. This silver image functions only as a medium for converting an emulsion layer to a resist image corresponding to an original image. That is, in ordinary photography, the optical density of silver image is reduced, with a reduction in the thickness of the emulsion layer, to an extent that it is not practically usable, while, in the present invention, the thickness of the emulsion layer is such that the emulsion layer is removed according to the original image to form a resist image of the emulsion layer. Therefore, a film thickness as thin as about 1/15 that necessary for obtaining sufficient optical density using an ordinary photographic emulsion is employable (provided that the proportion of silver in the emulsion is the same). The thinness of the emulsion layer provides the following advantages, and the resulting image is superior to that obtained in ordinary photography. A first advantage is that the thinness serves to reduce the scattering of light by the silver halide grains in the emulsion layer, thus improving the resolving power. A second advantage is that the thinness enables an image to be focused upon projecting an image on an emulsion layer through a lens. That is, in an optical system to obtain the resolving power of about 500 to 1000 lines/mm, the focal depth is around $5\mu$, and hence the thickness of the emulsion is desirably much less than this. However, ordinary silver halide photographic emulsion has a thickness $5\mu$ or higher. A third advantage is that the thinness serves to minimize the reduction in resolving power due to halation. A fourth advantage is that, in conducting etch-bleaching or a like chemical processing or baking, the thinness serves to improve the resolving power. A fifth advantage is that less silver is used.

The following examples are given to illustrate the present invention in greater detail. Unless otherwise indicated all parts, percents, ratios and the like are by weight.

EXAMPLE 1

1400 ml of a silver bromide emulsion (mean grain size of silver bromide; about $0.06\mu$) was prepared using 50 g of gelatin and 188 g of silver bromide. To this emulsion was added 0.25 g of 4-methyl-2,3-di-ethoxathizaolocarbocyanine iodide to optically sensitize the emulsion to light of a wavelength of 510 to 530 m$\mu$. Then the emulsion was coated in a thickness of about $2\mu$ on a chromium layer of a thickness of about $0.1\mu$ vacuum-deposited on a glass plate, and then dried to obtain a photographic light-sensitive material. This photographic light-sensitive material was imagewise exposed and development-processed in a developer having the following composition (24° C., 5 min), followed by fixing in a fixing solution (24° C., 1 min) to obtain a silver image

| Developer | |
|---|---|
| 1-Phenyl-3-pyrazolidone | 0.5 g |
| Sodium Sulfite | 50 g |
| Hydroquinone | 12 g |
| Sodium Carbonate (monohydrate) | 60 g |

| -continued | |
|---|---|
| Potassium Bromide | 2 g |
| Benzotriazole | 0.2 g |
| 1-Phenyl-5-mercaptotetrazole | 5 ml |
| Phenazine-2-carboxylic acid | 1 g |
| Phenazine-2-carboxylic acid | 1 g |
| Water to make | 1 liter |
| Fixing Solution | |
| 70% Aqueous Solution of Ammonium Thiosulfate | 200 cc |
| Sodium Sulfite | 15 g |
| Boric Acid | 8 g |
| Glacial Acetic Acid | 16 cc |
| Aluminum Sulfate | 10 g |
| Sulfuric Acid | 2 cc |
| Water to make | 1 liter |

Then, the photographic material was immersed in a bleaching solution having the following composition for 2 minutes at 20° C., then washed and processed with the above-described fixing solution to dissolve away the silver at the image areas, followed by washing with water and drying.

| Bleaching Solution | |
|---|---|
| Potassium Dichromate | 15 g |
| Concentrated (35 wt%) Hydrochloric Acid | 8 ml |
| Water to make | 1 liter |

After being dried, the photographic material was heated for about 3 minutes in air at about 400° C. for baking, and immersed for about 1 minute in an etching solution having the following composition. Thus, the chromium layer at the exposed areas was etched away.

| Etching Solution | |
|---|---|
| Cerium Ammonium Nitrate | 164.5 g |
| 70% Perchloric Acid | 43 ml |
| Water to make | 1 liter |

Then, the photographic material was immersed for 3 minutes in a 20% aqueous solution of sodium hydroxide (40° C.) to thereby remove the baked gelatin layer.

Excellent results of sharp and high contrast 1 $\mu$m lines were obtained.

EXAMPLE 2

The same procedures as described in Example 1 were conducted except for replacing the chromium with chromium oxide (thickness: $0.22\mu$). Substantially the same results as set forth in Example 1 were obtained.

EXAMPLE 3

Iron was vacuum-deposited in a thickness of about $0.2\mu$ on a glass support and heated for 5 minutes at 450° C. in air for conversion to iron oxide. On this was coated the same silver halide emulsion as in Example 1. Subsequent procedures up to the bleaching were conducted in a similar manner to those of Example 1. After being dried, the material was heated for 2 minutes and 30 seconds at 500° C. in air, and then immersed for about 1 minute in a bath prepared by diluting concentrated hydrochloric acid 6 times and heating to 40° C., to thereby etch the iron oxide layer. Substantially the same results as set forth in Example 1 were obtained.

EXAMPLE 4

The same procedure as described in Example 1 were conducted except for effecting the following procedure in place of the fixing of Example 1. That is, the material was washed with water, subsequent to development, for 10 minutes without fixing, followed by dissolving away the silver image with the following bleaching solution.

| Bleaching Solution | |
| --- | --- |
| Potassium Dichromate | 5 g |
| Concentrated (98 wt%) Sulfuric Acid | 10 ml |
| Water to make | 1 liter |

Subsequently, the material was washed with water for 10 minutes, and silver halide at the unexposed areas was dissolved away with the fixing solution described in Example 1. After washing with water and drying, the photographic material was heated in air for about 3 minutes at 400° C. Thus, the masking layer at the image areas (exposed areas) was uncovered. The processing after etching the uncovered masking layer were conducted in the same manner as in Example 1. Substantially the same results as set forth in Example 1 were obtained.

EXAMPLE 5

The same procedure as described in Example 4 were conducted except for washing with water and drying after bleaching without conducting the step of dissolving away the silver halide. The subsequent processings were the same as in Example 4. Substantially the same results as set forth in Example 1 were obtained.

EXAMPLE 6

The same procedures as described in Example 4 were conducted except for blackening after bleaching, silver halide with the developer described in Example 1. After washing and drying, the procedures subsequent to baking were conducted in the same manner as in Example 4. Substantially the same results as set forth in Example 1 were obtained.

EXAMPLE 7

The same procedures as described in Example 1 were conducted except for using titanium in place of the chromium. As the etching solution for titanium, a mixture prepared by mixing 1 volume of 48% hydrofluoric acid with 10 volumes of 40% ammonium fluoride was used. The etching took about 1 minute. Substantially the same results as set forth in Example 1 were obtained.

EXAMPLE 8

The same procedures as described in Example 1 were conducted except for using silicon dioxide and an impurity in place of chromium. The silicon dioxide layer was applied on a glass plate by sputtering and had a thickness of about 0.3μ. Upon sputtering, silver was sputtered at the same time to incorporate silver as an impurity into the silicon dioxide layer. Thus, the silicon dioxide masking layer was a clear yellow. The etching of this masking layer was effected using the following etching solution.

| 48% Hydrofluoric Acid | 1 volume |
| --- | --- |
| 40% Ammonium Fluoride | 12 volumes |

The etching took 30 seconds and substantially the same results as set forth in Example 1 were obtained.

EXAMPLE 9

The same procedures as described in Example 4 were conducted except for conducting the following procedure in place of the fixing. That is, a photographic material was washed, without fixing, with water for 2 minutes subsequent to development, followed by dissolving away the silver image with an aqueous solution prepared by diluting 61% nitric acid 5 times with water.

Subsequently, the material was washed with water for 10 minutes and uniformly exposed for 2 minutes at a distance of 2 meters from a 100 W tungsten electric bulb. The exposure amount was about 12,000 lx.sec. Furthermore, the material was developed for 3 minutes at 20° C. in the following developer, followed by bleaching the silver image with the same bleaching solution as described in Example 1. Then, the silver image was dissolved away with the same fixing solution as in Example 1.

| Developer | |
| --- | --- |
| Monomethyl-p-aminophenol | 2 g |
| Hydroquinone | 4 g |
| Sodium Sulfite (Anhydrous) | 25 g |
| Sodium Carbonate (Anhydrous) | 18.5 g |
| Potassium Bromide | 2 g |
| Water to make | 1 liter |

After being washed with water for 10 minutes, the material was heated for about 3 minutes at 400° C. in air. Thus, the gelatin located at the former silver image areas turned dark brown, while the gelatin at the other areas was evaporated. Etching of the masking layer and the subsequent processings were conducted in the same manner as in Example 1. Substantially the same results as set forth in Example 1 were obtained.

EXAMPLE 10

The same procedures as described in Example 5 were conducted except for changing the masking layer from chromium to the iron oxide used in Example 3 and conducting the following processings in place of the etching after baking. That is, after uncovering the masking layer at the image areas by baking, the etching of the masking layer was effected through a sputter-etching method. The conditions of the sputter-etching were as follows.

| Sputtering Gas: | Argon |
| --- | --- |
| Frequency of Electric Power Source: | 13.56 MHz |
| Power: | 800 W |
| Distance Between Electrode: | 50 mm |
| Gas Pressure: | $1.2 \times 10^{-2}$ mmHg |
| Sputtering Time: | 9 minutes |

The baked sample was placed on a 5 mm-thick quartz plate positioned on a stainless steel cathode. The etching of the masking layer and subsequent processings were conducted in the same manner as in Example 1. Substantially the same results as set forth in Example 1 were obtained.

EXAMPLE 11

The same procedures as described in Example 1 were conducted except for adjusting the thickness of the emulsion layer to 0.6μ. Thus, an image having higher resolving power than in Example 1 was obtained.

While the invention has been described in detail and with reference to specific embodiments thereof, it will be apparent to one skilled in the art that various changes and modifications can be made therein without departing from the spirit and scope thereof.

What is claimed is:

1. A method for producing a photo mask, which comprises exposing and development-processing a photographic light-sensitive material comprising a transparent support having thereon a masking layer and a silver halide emulsion layer to thereby form a silver image, bleaching said silver image with a bleaching solution containing hexavalent chromium ion, heating in the presence of oxygen to imagewise uncover the masking layer, etching away the uncovered masking layer, and then removing the emulsion layer at the non-image areas to uncover the masking layer corresponding to the non-image areas.

2. The method of claim 1, wherein said support is a glass plate, quartz, sapphire, or a synthetic resin film.

3. The method of claim 1, wherein said masking layer is a layer of a material which transmits visible light and absorbs ultraviolet light.

4. The method of claim 1, wherein said masking layer is a layer of a metal, a metal oxide, a semi-metal, or a chalcogen glass.

5. The method of claim 4, wherein said metal oxide is silicon dioxide, chromium oxide, ferric oxide, magnetic iron oxide, iron (II)-iron (III) oxide, cuprous oxide, cupric oxide, nickel oxide, cobalt oxide, germanium oxide, cadmium oxide, titanium oxide, or tantalum oxide, said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy or a nickel-chromium alloy, said semi-metal is silicon or germanium and said chalcogen glass is As—S—Ge, As—Se—Ge, or Ge—S.

6. The method of claim 3, wherein said masking layer transmits well light of a wavelength not less than about 400 nm and well absorbs light having a wavelength shorter than about 400 nm.

7. The method of claim 1, wherein said masking layer has a thickness ranging from about 0.01 to 10 microns.

8. The method of claim 1, wherein said silver halide emulsion layer is an emulsion layer of silver chloride, silver bromide, silver iodide, silver chlorobromide, silver bromoiodide, or silver chlorobromoiodide.

9. The method of claim 8, wherein said silver halide emulsion is an emulsion containing about 90 mole % or higher silver bromide and not more than about 5 mole % silver iodide and the mean grain size of the silver halide grains is not more than about 0.1 micron and wherein the weight ratio of the silver halide to the water-soluble binder of the emulsion is about 1:4 to about 6:1.

10. The method of claim 8, wherein said silver halide emulsion is an emulsion which contains about 50 mole % or higher silver chloride and contains silver halide grains having a mean grain size of not more than about 1 micron.

11. The method of claim 1, wherein said silver halide emulsion layer has a thickness of less than about 10 microns.

12. The method of claim 1 wherein the source of said hexavalent chromium ion is sodium dichromate, potassium dichromate, ammonium dichromate, sodium chromate, potassium chromate or ammonium chromate.

13. The method of claim 1, wherein the baking is in an oxygen containing atmosphere at a temperature of at least about 150° C.

14. The method of claim 1, wherein said etching is by chemical etching or sputter etching.

15. The method of claim 1, wherein the removing of the non-silver image areas is by swelling or dissolving the binder layer remaining using an alkali solution, a hypochlorite solution or an acid solution.

16. The method of claim 1, wherein said bleaching of said silver image is with a solution containing hexavalent chromium ion and a mineral acid.

17. The method of claim 16, wherein the source of said hexavalent chromium ion is sodium dichromate, potassium dichromate, ammonium dichromate, sodium chromate, potassium chromate or ammonium chromate.

18. The method of claim 1, wherein in said bleaching said silver image is converted to a silver halide image and said method further comprises dissolving away said silver halide prior to heating.

19. The method of claim 1, wherein in said bleaching said silver is dissolved in a bleaching solution to result in image areas which do not contain silver halide.

20. The method of claim 1, wherein, said bleaching solution also contains halide ion, and said method additionally includes dissolving away silver halide formed during said bleaching prior to said heating in the presence of oxygen.

21. The method of claim 14, wherein said chemical etching is with an aqueous etching solution.

22. The method of claim 1, wherein said photographic light-sensitive material comprises a transparent support having thereon in order from the support a masking layer and a silver halide emulsion layer.

23. The method of claim 1 wherein said photographic light-sensitive material consists essentially of a transparent support having thereon in order from the support a masking layer and a silver halide emulsion layer.

24. The method of claim 14 wherein said photographic light-sensitive material consists essentially of a transparent support having thereon in order from the support masking layer and a silver halide emulsion layer.

25. The method of claim 21 wherein said photographic light-sensitive material consists essentially of a transparent support having thereon in order from the support a masking layer and a silver halide emulsion layer.

* * * * *